(12) United States Patent
Abe

(10) Patent No.: US 9,535,327 B2
(45) Date of Patent: Jan. 3, 2017

(54) METHOD FOR FABRICATING SEMICONDUCTOR DEVICE, PATTERN WRITING APPARATUS, RECORDING MEDIUM RECORDING PROGRAM, AND PATTERN TRANSFER APPARATUS

(71) Applicant: NuFlare Technology, Inc., Numazu-shi (JP)

(72) Inventor: Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 14/792,192

(22) Filed: Jul. 6, 2015

(65) Prior Publication Data

US 2015/0309412 A1 Oct. 29, 2015

Related U.S. Application Data

(62) Division of application No. 13/431,229, filed on Mar. 27, 2012, now Pat. No. 9,122,176.

(30) Foreign Application Priority Data

Mar. 31, 2011 (JP) ................ 2011-077811

(51) Int. Cl.
| | | |
|---|---|---|
| G06F 17/50 | (2006.01) | |
| G03F 7/20 | (2006.01) | |
| G03F 1/36 | (2012.01) | |
| G03F 1/70 | (2012.01) | |
| G03F 1/78 | (2012.01) | |
| H01L 21/308 | (2006.01) | |

(52) U.S. Cl.
CPC . *G03F 7/20* (2013.01); *G03F 1/36* (2013.01); *G03F 1/70* (2013.01); *G03F 1/78* (2013.01); *G03F 7/2063* (2013.01); *H01L 21/3086* (2013.01)

(58) Field of Classification Search
USPC ............................................ 716/52; 430/394
See application file for complete search history.

(56) References Cited

U.S. PATENT DOCUMENTS

| | | |
|---|---|---|
| 6,780,574 B2 | 8/2004 | Kawashima |
| 7,316,870 B2 | 1/2008 | Eurlings et al. |
| 7,511,290 B2 | 3/2009 | Suzuki et al. |
| 7,525,110 B2 | 4/2009 | Suzuki et al. |
| 7,601,968 B2 | 10/2009 | Abe et al. |
| 7,608,845 B2 | 10/2009 | Abe et al. |
| 7,619,230 B2 | 11/2009 | Suzuki et al. |
| 7,662,522 B2 | 2/2010 | Abe |
| 7,669,174 B2 | 2/2010 | Emi et al. |
| 7,705,321 B2 | 4/2010 | Abe |
| 7,740,991 B2 | 6/2010 | Emi et al. |
| 7,759,659 B2 | 7/2010 | Abe et al. |
| 7,863,586 B2 | 1/2011 | Abe |
| 7,872,745 B2 | 1/2011 | Abe et al. |
| 7,928,414 B2 | 4/2011 | Abe |
| 7,973,918 B2 | 7/2011 | Tsuchiya et al. |
| 8,023,103 B2 | 9/2011 | Shibazaki et al. |
| 8,031,932 B2 | 10/2011 | Tsuchiya et al. |
| 8,065,635 B2 | 11/2011 | Yashima et al. |
| 8,078,012 B2 | 12/2011 | Abe et al. |
| 8,080,809 B2 | 12/2011 | Abe |
| 8,103,980 B2 | 1/2012 | Emi et al. |
| 8,122,390 B2 | 2/2012 | Yashima et al. |
| 8,153,996 B2 | 4/2012 | Abe et al. |
| 8,309,283 B2 | 11/2012 | Kato et al. |
| 8,352,889 B2 | 1/2013 | Emi et al. |
| RE44,179 E | 4/2013 | Abe et al. |
| 8,429,575 B2 | 4/2013 | Yashima et al. |
| 8,527,913 B2 | 9/2013 | Yashima et al. |
| 8,737,676 B2 | 5/2014 | Tsuchiya et al. |
| 8,781,212 B2 | 7/2014 | Tsuchiya et al. |
| 8,983,113 B2 | 3/2015 | Tsuchiya et al. |
| 2007/0050741 A1* | 3/2007 | Ogawa ................ G03F 1/36 716/52 |
| 2014/0162466 A1* | 6/2014 | Fujimura ............ G06F 17/5072 438/798 |
| 2015/0131892 A1 | 5/2015 | Tsuchiya et al. |
| 2015/0198896 A1 | 7/2015 | Abe et al. |

FOREIGN PATENT DOCUMENTS

| | | |
|---|---|---|
| JP | 5-326359 | 12/1993 |
| JP | WO 00/28380 | 5/2000 |
| JP | 2000-277426 | 10/2000 |
| JP | 2001-319874 | 11/2001 |
| JP | 2004-153120 | 5/2004 |
| JP | 2005-195787 | 7/2005 |
| JP | 2006-350395 | 12/2006 |
| JP | 2007-72423 | 3/2007 |
| JP | 2008-311502 | 12/2008 |
| WO | 2007/100081 A1 | 9/2007 |

OTHER PUBLICATIONS

Robert Socha, et al. "Simultaneous Source Mask Optimization (SMO)", Proceedings of SPIE, vol. 5853, 2005, pp. 180-193.
Jörg Zimmermann, et al. "Generation of arbitrary freeform source shapes using advanced illumination systems in high-NA immersion scanners", Proceedings of SPIE, vol. 7640, 2010, pp. 764005-1-764005-15.
Office Action issued Oct. 21, 2014 in Japanese Patent Application No. 2011-077811 (with English translation).

* cited by examiner

Primary Examiner — Daborah Chacko Davis
(74) Attorney, Agent, or Firm — Oblon, McClelland, Maier & Neustadt, L.L.P.

(57) ABSTRACT

A method for fabricating a semiconductor device, includes dividing a pattern region of a desired pattern that is to be formed on a semiconductor substrate into a plurality of sub-regions; calculating combination condition including a shape of illumination light for transferring and a mask pattern obtained by correcting a partial pattern in the sub-region of the desired pattern formed on a mask used during transferring for each of the plurality of sub-regions, to make a dimension error of the partial pattern of each of the plurality of sub-regions smaller when transferred to the semiconductor substrate; and forming the desired pattern by making multiple exposures on the semiconductor substrate in such a way that the partial patterns of the sub-regions divided are sequentially transferred by transferring a pattern to the semiconductor substrate using the combination conditions calculated for each of the sub-regions.

11 Claims, 10 Drawing Sheets

METHOD FOR FABRICATING SEMICONDUCTOR DEVICE, PATTERN WRITING APPARATUS, RECORDING MEDIUM RECORDING PROGRAM, AND PATTERN TRANSFER APPARATUS

CROSS-REFERENCE TO RELATED APPLICATION

This application is a divisional of U.S. patent application Ser. No. 13/431,229, filed Mar. 27, 2012, which is based upon and claims the benefit of priority from prior Japanese Patent Application No. 2011-077811 filed on Mar. 31, 2011 in Japan, the entire contents of which are incorporated herein by reference.

BACKGROUND OF THE INVENTION

1. Field of the Invention

Embodiments described herein relate generally to a method for fabricating a semiconductor device, a pattern writing apparatus, a recording medium recording a program, and a pattern transfer apparatus, and for example, relates to a method for fabricating a semiconductor device that controls a pattern formed on a mask and illumination light of a pattern writing apparatus that transfers the mask pattern onto a semiconductor substrate and related devices thereof.

2. Related Art

A lithography technique which leads development of micropatterning of a semiconductor device is a very important process for exclusively generating a pattern in semiconductor fabricating processes. In recent years, with an increase in integration density of an LSI, a circuit line width required for semiconductor devices is getting smaller year by year. In order to form a desired circuit pattern on such a semiconductor device, a high-precision original pattern (also called a reticle or a mask) is needed. In this case, an electron beam pattern writing technique essentially has an excellent resolution, and is used in production of high-precision original patterns.

FIG. 11 is a conceptual diagram for explaining an operation of a variable-shaped electron beam pattern writing apparatus. The variable-shaped electron beam (EB: Electron Beam) pattern writing apparatus operates as described below. In a first aperture plate 410, a quadrangular opening 411 to shape an electron beam 330 is formed. In a second aperture plate 420, a variable-shaped opening 421 to shape the electron beam 330 having passed through the opening 411 of the first aperture plate 410 into a desired quadrangular shape is formed. The electron beam 330 irradiated from the charged particle source 430 and having passed through the opening 411 of the first aperture plate 410 is deflected by a deflector and passes through a portion of the variable-shaped opening 421 of the second aperture plate 420 to irradiate a target object 340 mounted on a stage continuously moving in one predetermined direction (for example, the X direction) with the electron beam 330. That is, a quadrangular shape which can pass through both the opening 411 of the first aperture plate 410 and the variable-shaped opening 421 of the second aperture plate 420 is formed in a pattern writing region of the target object 340 mounted on the stage continuously moving in the X direction. The scheme for causing a beam to pass through both the opening 411 of the first aperture plate 410 and the variable-shaped opening 421 of the second aperture plate 420 to form an arbitrary shape is called a variable-shaping scheme (VSB scheme).

With an increasing degree of integration of pattern, the line width precision of a pattern on a silicon wafer of up to 3 to 5 nm is now demanded. The method of changing illumination of a transfer apparatus (scanner) to increase the resolution of a pattern is proposed (see, for example, "Generation of arbitrary freeform source shapes using advanced illumination system in high-NA immersion scanners", Proc. of SPIE Vol. 7640 764005-1). Also, the method of transfer by grouping patterns desired to be transferred onto a wafer and changing the shape of illumination light of each group by fitting to the trend of the pattern is proposed (see, for example, Japanese Patent Application laid-Open No. 2008-311502). However, dimensions change due to the optical proximity effect when a pattern of a mask is transferred onto a wafer and thus, the pattern is corrected to correct dimensional changes. Then, the corrected pattern will be formed on the mask. Thus, even if the illumination shape is selected by fitting to the pattern to be transferred, the actual mask pattern is different, causing dimension errors of the pattern. Further, dense patterns and coarse patterns are internally mixed in an LSI pattern. Thus, it is difficult to improve dimensional precision for all patterns at the same time.

BRIEF SUMMARY OF THE INVENTION

In accordance with one aspect of the present invention, a method for fabricating a semiconductor device, includes: dividing a pattern region of a desired pattern that is to be formed on a semiconductor substrate into a plurality of sub-regions; calculating combination condition including a shape of illumination light for transferring and a mask pattern obtained by correcting a partial pattern in the sub-region of the desired pattern formed on a mask used during transferring for each of the plurality of sub-regions, to make a dimension error of the partial pattern of each of the plurality of sub-regions smaller when transferred to the semiconductor substrate; and forming the desired pattern by making multiple exposures on the semiconductor substrate in such a way that the partial patterns of the sub-regions divided are sequentially transferred by transferring a pattern to the semiconductor substrate using the combination conditions calculated for each of the sub-regions.

In accordance with another aspect of the present invention, a pattern writing apparatus, includes: a storage unit configured to input and store pattern data of a mask pattern of each of a plurality of sub-regions created by dividing a pattern region of a desired pattern that is to be formed on a semiconductor substrate; a merge processing unit configured to read the pattern data of the mask pattern of each of the sub-regions to merge the mask pattern of each of the sub-regions to a position before the pattern region being divided; a correction amount calculation unit configured to calculate a correction amount to correct a pattern dimension error in a mesh region created by virtually dividing the pattern region into a plurality of mesh regions in a mesh state by using the mask pattern merged; and a pattern writing unit configured to write the mask pattern corrected by the correction amount for each of the mesh regions in an independent separate position on a mask for each of the sub-regions.

In accordance with a further aspect of the present invention, a readable recording medium recording a program to cause a computer to execute: storing first pattern data of a desired pattern that is to be formed on a semiconductor substrate to a storage device; dividing a pattern region of the desired pattern into a plurality of sub-regions; calculating combination condition including a shape of illumination light for transferring and a mask pattern obtained by correcting a partial pattern in the sub-region of the desired pattern formed on a mask used during transferring for each of the plurality of sub-regions, to make a dimension error of the partial pattern of each of the plurality of sub-regions smaller when transferred to the semiconductor substrate; and outputting correlation data of the combination condition calculated and second pattern data of a mask pattern to be a corresponding pattern shape for each of the sub-regions.

In accordance with a further aspect of the present invention, a transfer apparatus, includes: a reading unit configured to optically read first divided region information indicating positions of a plurality of sub-regions created by dividing a pattern region of a desired pattern that is to be formed on a semiconductor substrate and a plurality of pieces of first illumination light information indicating a shape of illumination light to be paired with a mask pattern for each of the sub-region from a mask; a judgment unit configured to input a plurality of pieces of second illumination light information indicating the mask pattern of each sub-region and the shape of the illumination light paired for each of the sub-regions to judge whether the first illumination light information and the second illumination light information match for each of the sub-regions; and an exposure unit configured to make multiple exposures of the semiconductor substrate in such a way that partial patterns of the sub-regions divided are sequentially transferred by transferring the mask pattern for the sub-region concerned to the semiconductor substrate with the illumination light in the shape indicated by the illumination light information judged to match for each of the sub-regions.

DETAILED DESCRIPTION OF THE INVENTION

In an embodiment below, a method for fabricating a semiconductor device capable of further reducing dimension errors of a pattern transferred to a semiconductor substrate in the end will be described. Also, a pattern writing (or "drawing") apparatus that makes more precise corrections when size fluctuations are corrected will be described. Also, a transfer apparatus capable of further reducing dimension errors of a pattern transferred to a semiconductor substrate in the end will be described. Also, a program that generates pattern data capable of further reducing dimension errors of a pattern transferred to a semiconductor substrate in the end will be described.

In an embodiment below, a charged particle beam pattern writing apparatus will be described as a pattern writing apparatus, but the pattern writing apparatus is not limited to this example and may be a laser beam pattern writing apparatus. A configuration using an electron beam will be described as an example of the charged particle beam, but the charged particle beam is not limited to the electron beam and may be a beam using charged particles such as an ion beam. A variable-shaped pattern writing apparatus will be described as an example of the charged particle beam pattern writing apparatus.

First Embodiment

Figure 1:
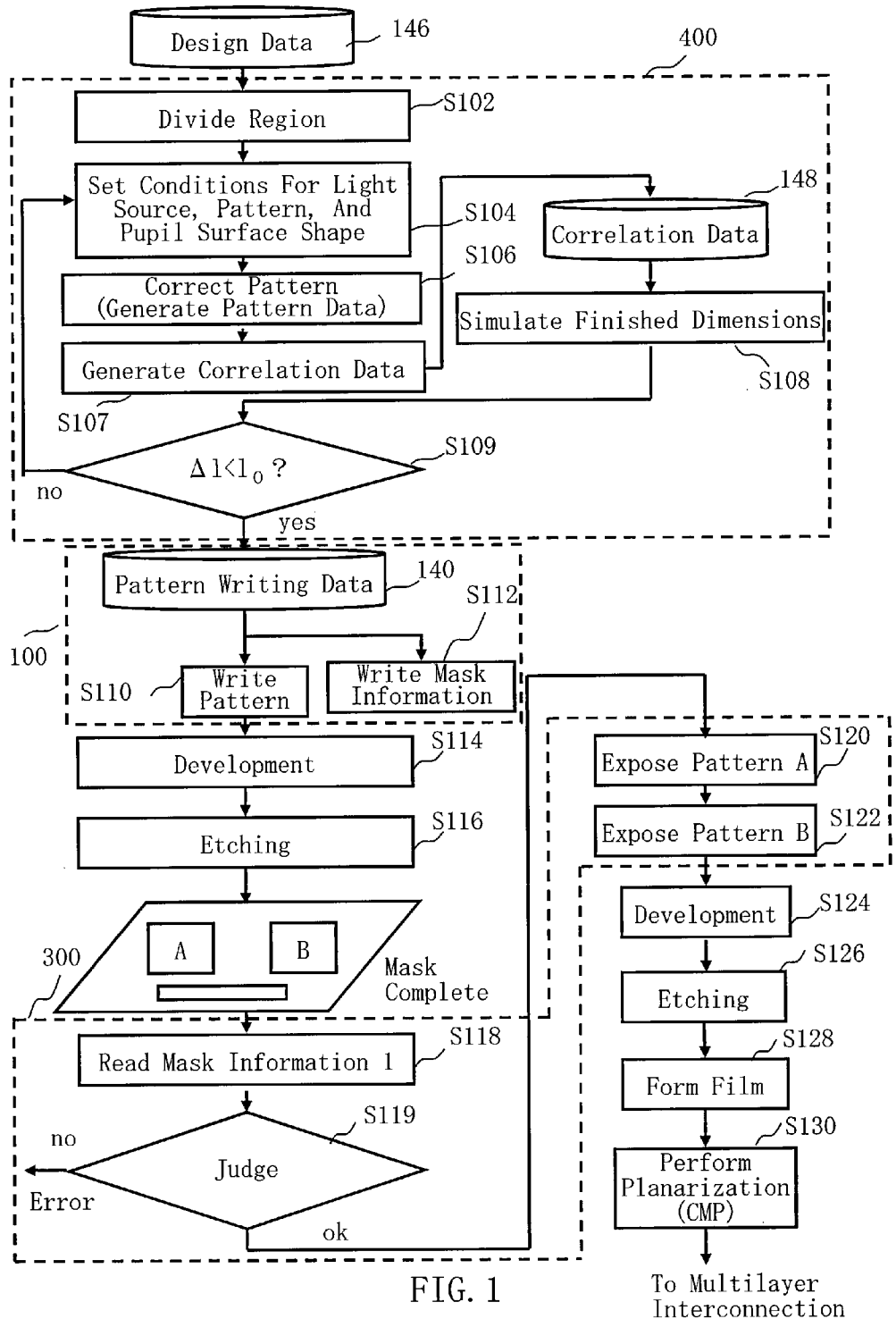
FIG. 1 is a flow chart showing principal processes of a method for fabricating a semiconductor device according to a first embodiment.

FIG. 1 is a flow chart showing principal processes of a method for fabricating a semiconductor device according to a first embodiment. In FIG. 1, in the method for fabricating a semiconductor device according to the first embodiment, a series of processes including a pattern writing (or "drawing") data generation process (S102 to S109), a pattern writing (or "drawing") process (S110 to S112), a mask pattern forming process (S114 to S116), a transfer process (S117 to S122), and a wafer pattern forming process (S124 to S130) are performed. In the pattern writing data generation process, a series processes including a region division process (S102), a condition setting process (S104), a pattern correction process (S106), a correlation data generation process (S107), a simulation process (S108), and a judgment (S109) are performed as internal processes thereof. In the pattern writing process, a series of processes including a pattern writing process (S110) and a mask information forming process (S112) are performed as internal processes thereof. In the mask pattern forming process, a series of processes including a development process (S114) and an etching process (S116) are performed as internal processes thereof. In the transfer process, a series of processes including a mask information reading process (S118), a judgment process (S119), a pattern A exposure process (S120), and a pattern B exposure process (S122) are performed as internal processes thereof. In the wafer pattern forming process, a series of processes including a development process (S124), an etching process (S126), a film forming process (S128), and a planarization process (S130) are performed as internal processes thereof.

Figure 2:
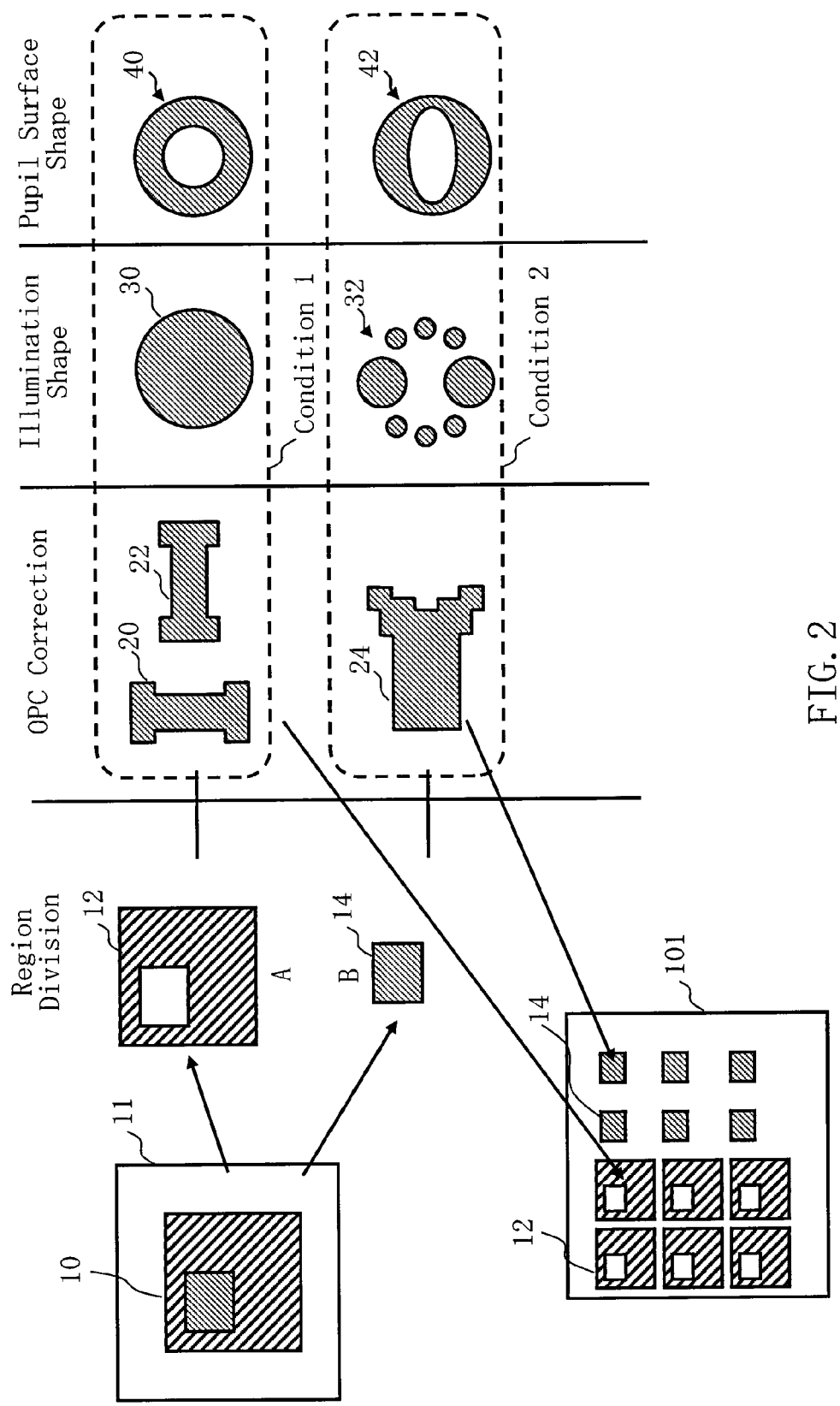
FIG. 2 is a conceptual diagram exemplifying a pattern to be transferred to a semiconductor substrate, a pattern formed on a mask, and a relationship among a pattern shape, illumination light shape, and pupil surface shape in the first embodiment.

FIG. 2 is a conceptual diagram exemplifying a pattern to be transferred to a semiconductor substrate, a pattern formed on a mask, and a relationship among a pattern shape, illumination light shape, and pupil surface shape in the first embodiment. When a pattern on the semiconductor substrate (wafer) is transferred, dimensions of the transferred pattern depend on the pattern shape thereof, the shape of illumination light in the transfer apparatus, and transmittance of a luminous flux in the pupil surface position after passing through a mask. On the other hand, the pattern transferred to the wafer has various shapes such as a dense pattern and a coarse pattern. In addition, even if a design pattern to be transferred onto a wafer is formed on the mask unchanged, the pattern is not transferred in desired dimensions due to an influence of the optical proximity effect or the like during transfer. Thus, the pattern formed on the mask is corrected by making optical proximity effect corrections (OPC) and the corrected pattern is formed on the mask as a mask pattern. Thus, the pattern to be transferred to a wafer and the pattern formed on a mask are also different in shape. Thus, in the first embodiment, the combination of the mask pattern, the shape of illumination light, and the luminous flux shape in the pupil surface position is first optimized by doing a simulation to minimize pattern dimension errors of a pattern formed on the wafer in the end with respect to design dimensions. Then, optimized mask pattern data and correlation data to be conditions therefor are generated.

The pattern writing data generation process is calculated by using a control computer 400. Storage devices 146, 148 such as magnetic disk drives are connected to the control computer 400 via a bus (not shown). In addition, other components normally needed for performing computer processing may be mounted on or connected to the control computer 400. First, design data (first pattern data) of a desired pattern that will be formed on a semiconductor substrate (wafer) is input into the storage device 146 from outside to store the design data in the storage device 146. In the design data, pattern data of a pattern to be formed on a wafer as a semiconductor substrate in the end is defined.

As the region division process (S102), the control computer 400 first reads pattern data from the storage device 146 and divides a pattern region of a desired pattern that will be formed on a semiconductor substrate (wafer) into a plurality of sub-regions. Assume, for example, a case when a chip pattern (transfer pattern) should be transferred to a region 11 on the wafer in the end. In such a case, according to the first embodiment, a pattern region 10 of the chip pattern is divided into a plurality of sub-regions such as a sub-region 12 and a sub-region 14. The number of divided regions is not limited to two and may be three or more. For example, it is suitable to divide a region into a region in which the pattern density is dense and another region (coarse region). Alternatively, it is also suitable to divide a region into a region in which a line and space pattern is arranged and a region in which an isolated pattern like a contact pattern is arranged.

As the condition setting process (S104), conditions including the shape of illumination light during transfer, the pattern shape of a mask pattern, and the pupil surface shape of light in the pupil surface position during transfer are set for each sub-region. For example, conditions including the shape of illumination light during transfer, the pattern shape of a mask pattern, and the pupil surface shape of light in the pupil surface position during transfer are set.

As the pattern correction process (S106), the control computer 400 corrects the mask pattern for each sub-region so that a transfer pattern obtained when the mask pattern is transferred onto a wafer is brought closer to a partial pattern obtained by dividing the design pattern into sub-regions under the conditions of the shape of illumination light calculated for each sub-region and the pupil surface shape of light in the pupil surface position during transfer. For example, the control computer 400 OPC-corrects the pattern for each sub-region so that a transfer pattern obtained when transferred by a scanner is brought closer to a partial pattern obtained by dividing the design pattern into sub-regions under the conditions of the shape of illumination light set for each sub-region and the pupil surface shape of light in the pupil surface position during transfer. For this purpose, the commonly used OPC technology, that is, the OPC technology under the conditions of the fixed shape of illumination light and the fixed pupil surface shape of light in the pupil surface position during transfer may be used. Then, the control computer 400 generates pattern data of the OPC-corrected mask pattern for each sub-region.

As the correlation data generation process (S107), the control computer 400 generates correlation data (condition data) among the shape of the acquired illumination light, the pattern shape of a mask pattern, and the pupil surface shape. Then, the generated correlation data is output to and stored in the storage device 148.

As the simulation process (S108), dimensions of the transfer pattern formed on the wafer using the mask pattern corrected under the above conditions are calculated by doing a simulation. For example, dimensions of the pattern formed on the wafer when an OPC-corrected pattern is transferred to the wafer under the set conditions are calculated by doing a simulation for each sub-region.

As the judgment process (S109), whether a dimension error between the partial pattern obtained by dividing the design pattern into sub-regions and the above transfer pattern obtained by doing a simulation is smaller than a threshold is judged. More specifically, for example, whether a simulated dimension is sufficiently precise (dimension error $\Delta l < $ threshold $l_0$) is judged and if the simulated dimension is sufficiently precise (for example, the error is 3 nm or less), the optimization of the sub-region is completed and the shape of illumination light, the pupil surface shape of light in the pupil surface position during transfer, and the OPC-corrected pattern set at this point are decided as the optimal combination for the sub-region. If sufficient precision cannot be obtained, the above processing is repeated by changing the set shape of illumination light and pupil surface of light in the pupil surface position during transfer so that the error becomes still smaller. As a result of judgment, as described above, condition settings of the above combination, corrections of the above mask pattern, generation of the above correlation data, and the above simulation are repeated until the dimension error becomes smaller than the threshold.

By generating pattern data by the control computer 400 as described above, pattern data in which dimension errors of a pattern transferred to a semiconductor substrate in the end can still be reduced can be generated.

In the manner described above, combination conditions containing the shape of illumination light for transferring and a mask pattern obtained by correcting a partial pattern in the sub-region of the desired pattern formed on a mask used during transferring for each of the plurality of sub-regions, to make a dimension error of the partial pattern of each of the plurality of sub-regions smaller when transferred to the semiconductor substrate are calculated (acquired) for each sub-region. For example, combination conditions of the shape of illumination light for transfer that makes the pattern dimension error of a partial pattern indicating the sub-region when transferred to a wafer smaller with respect to design dimension, the pattern shape of a mask pattern obtained by OPC-correcting the partial pattern defining all pattern in the sub-region concerned of the design pattern (desired pattern) formed on the mask used during transfer, and the pupil surface shape are calculated (acquired) for each sub-region.

More specifically, as shown, for example, in FIG. 2, the sub-region 12 is optimized by OPC-corrected patterns 20, 22, an illumination shape 30, and a pupil surface shape 40. Also, the sub-region 14 is optimized by an OPC-corrected pattern 24, an illumination shape 32, and a pupil surface shape 42.

Then, the control computer 400 outputs correlation data of acquired optimized combination conditions and pattern data (second pattern data) of the mask pattern to be the pattern shape of the optimized combination conditions to a pattern writing apparatus 100 for each sub-region.

In the above example, three conditions of the shape of illumination light, the pattern shape of a mask pattern, and the pupil surface shape are shown, but the conditions are not limited to the above example. Though precision may become lower than putting the three conditions together, an effect is achieved by configuring two conditions of the shape of illumination light and the pattern shape of a mask pattern.

Figure 3:
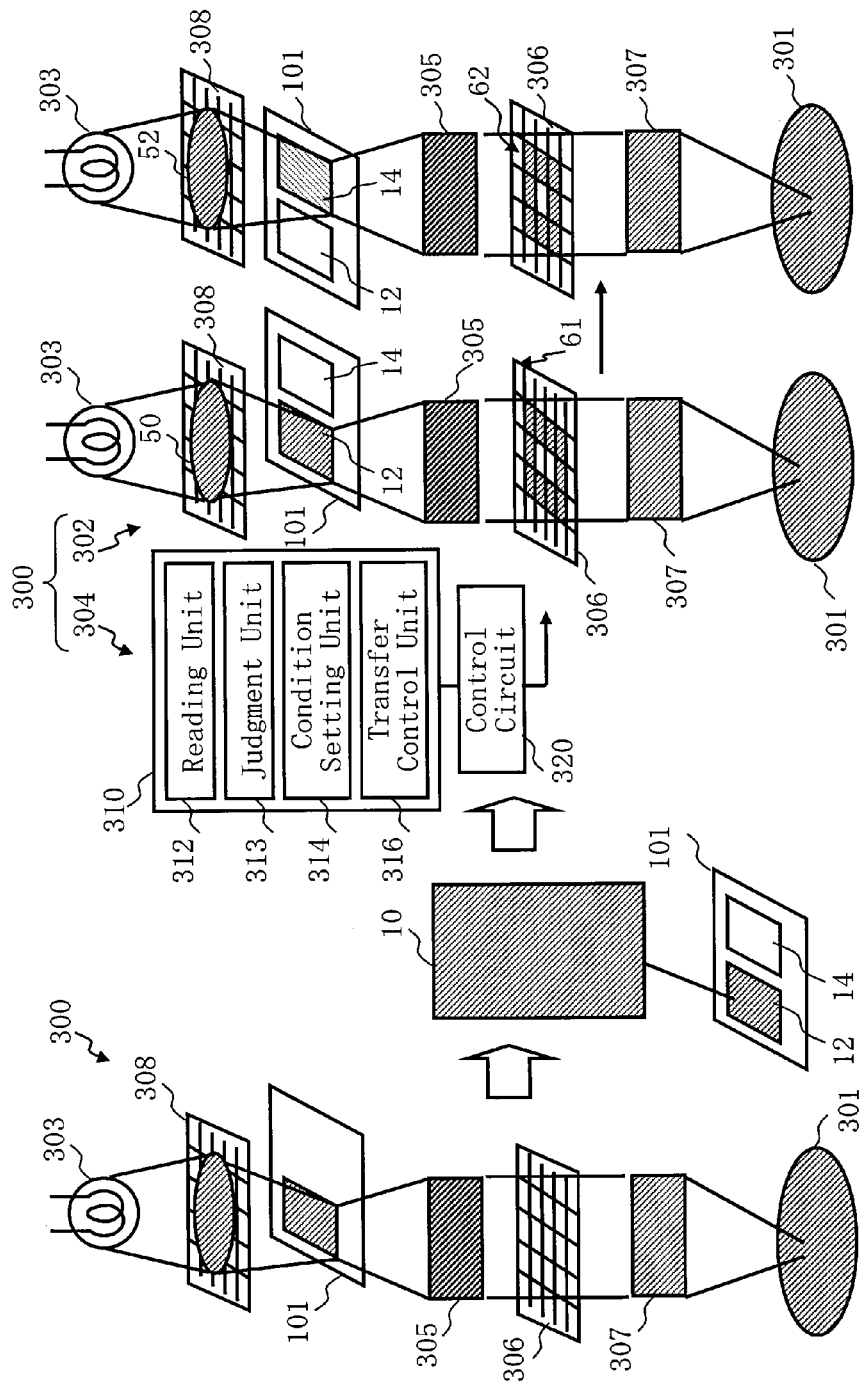
FIGS. 3A to 3D are conceptual diagrams for explaining a flow of the method for fabricating a semiconductor device and the configuration and operation of a transfer apparatus according to the first embodiment.

FIGS. 3A to 3D are conceptual diagrams for explaining a flow of the method for fabricating a semiconductor device and the configuration and operation of a transfer apparatus according to the first embodiment. FIG. 3A shows Comparative Example of the first embodiment. In FIG. 3A, an illumination shape adjustment substrate 308 is irradiated with light emitted from a light source 303 by an illumination optical system (not shown) in a transfer apparatus 300. A pattern on a mask 101 is irradiated with the light having passed through the illumination shape adjustment substrate 308 as illumination light. The light having passed through the mask passes through an optical system 305 to irradiate a pupil surface optical distribution adjustment substrate 306 arranged in the pupil surface position between the optical system 305 and an optical system 307. Then, the light having passed through the pupil surface optical shape adjustment substrate 306 forms an image in a desired position of a wafer 301 by the optical system 307. However, in FIG. 3A, even if the illumination shape should be selected by fitting to the pattern to be transferred, the actual mask pattern and the pattern to be transferred are different due to OPC corrections or the like, causing dimension errors of the pattern.

Thus, in the first embodiment, as shown in FIG. 3B, the pattern region 10 is divided into the sub-regions 12, 14 for separate exposure. In the transfer apparatus 300 according to the first embodiment, a reading unit 312 optically reads first divided region information indicating positions of a plurality of sub-regions created by dividing a pattern region of a desired pattern that will be formed on the wafer 301 and a plurality of pieces of first illumination light information indicating the mask pattern of each sub-region and the paired shape of illumination light from the mask. Then, a judgment unit 313 inputs a plurality of pieces of second illumination light information indicating the mask pattern of each sub-region and the paired shape of illumination light for each sub-region and judges whether the first illumination light information and the second illumination light information match. Then, a transfer unit 302 (exposure unit) makes multiple exposures of the semiconductor substrate so that the partial patterns of all divided sub-regions are sequentially transferred by transferring the mask pattern for the sub-region to the semiconductor substrate with illumination light in the shape indicated by illumination light information judged to match for each sub-region.

In the transfer apparatus 300, as shown in FIG. 3C, the illumination shape adjustment substrate 308 is irradiated with light emitted from the light source 303 by the illumination optical system (not shown). The adjustment substrate is adjusted so that transmitted light has a distribution 50. A pattern 12 on the mask 101 is irradiated with the light having passed through the illumination shape adjustment substrate 308 as illumination light. The light having passed through the mask passes through the optical system 305 to irradiate the pupil surface optical distribution adjustment substrate 306 arranged in the pupil surface position between the optical systems 305, 307. Then, the adjustment substrate is adjusted so that the transmitted light has a distribution 61. Then, the light having passed through the pupil surface optical shape adjustment substrate 306 forms an image in a desired position of the wafer 301 by the optical system 307. This operation is repeated while the wafer being moved to transfer the pattern of the sub-region 12 to a plurality of locations on the wafer. Next, as shown in FIG. 3D, the transmitted light is adjusted to have a distribution 52 by adjusting the illumination shape adjustment substrate 308, the transmitted light is adjusted to have a distribution 62 by adjusting the pupil surface optical distribution adjustment substrate 306, and the mask is moved to transfer the pattern of the sub-region 14 on the mask 101 to the wafer. This operation is repeated while the wafer being moved to transfer the pattern of the sub-region 14 to a plurality of locations on the wafer. The description below starts with pattern writing processing of a mask pattern.

As shown in FIGS. 2 and 3B, the mask pattern in each of the sub-region 12 and the sub-region 14 is formed on the mask 101 by the pattern writing apparatus 100 so that the sub-region 12 and the sub-region 14 are located in independent separate positions.

Figure 4:
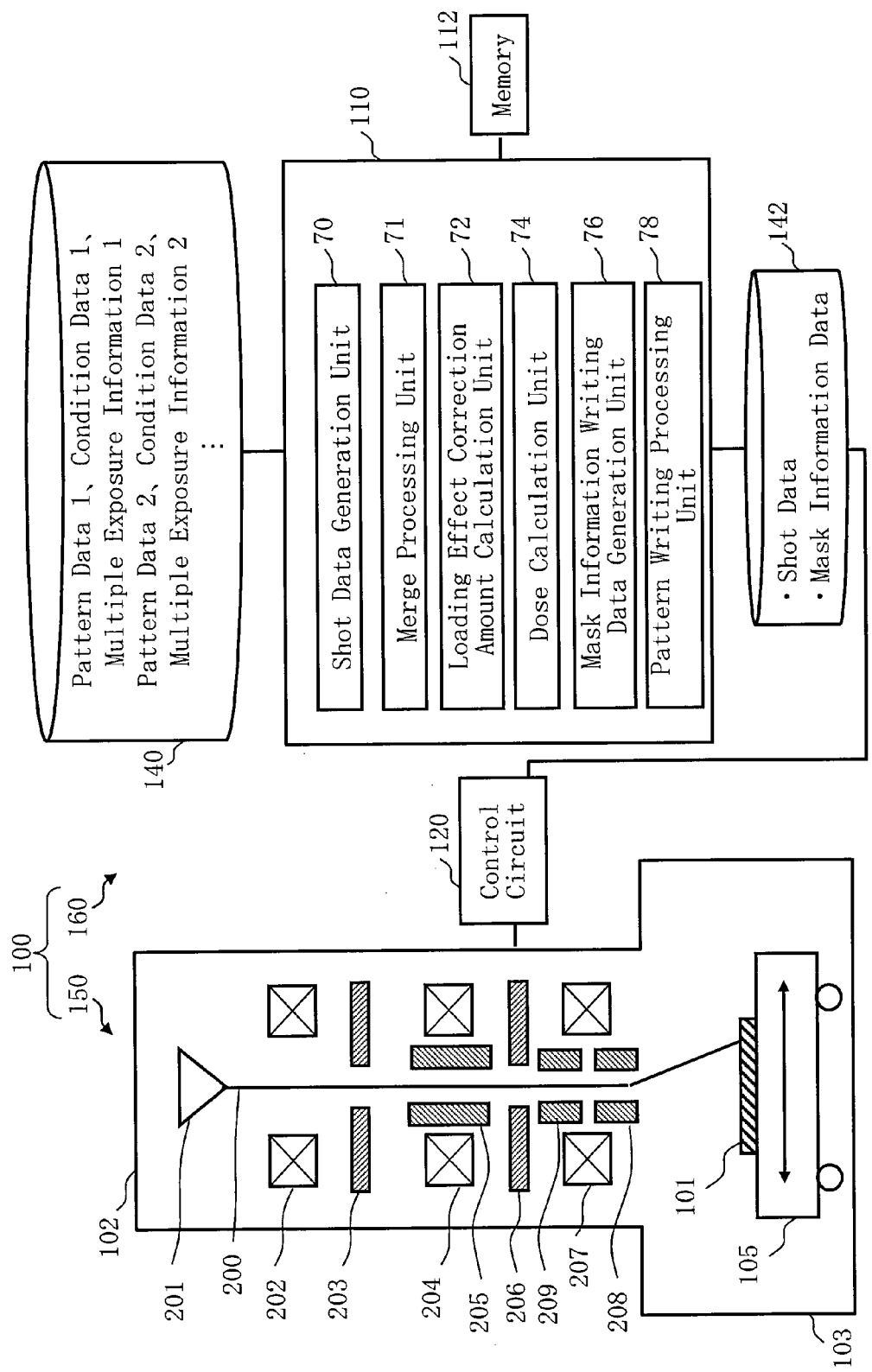
FIG. 4 is a conceptual diagram showing a configuration of a pattern writing apparatus according to the first embodiment.

FIG. 4 is a conceptual diagram showing the configuration of a pattern writing apparatus according to the first embodiment. In FIG. 4, the pattern writing apparatus 100 includes a pattern writing unit 150 and a control unit 160. The pattern writing apparatus 100 is an example of the charged particle beam pattern writing apparatus. Particularly, the pattern writing apparatus 100 is an example of the variable-shaped pattern writing apparatus. The pattern writing (or "drawing") unit 150 includes an electron lens barrel 102 and a pattern writing (or "drawing") chamber 103. In the electron lens barrel 102, an electron gun assembly 201, an illumination lens 202, a first aperture plate 203, a projection lens 204, a deflector 205, a second aperture plate 206, an objective lens 207, a main deflector 208, and a sub-deflector 209 are arranged. In the pattern writing chamber 103, an X-Y stage 105 is arranged. On the XY stage 105, the substrate 101 for mask production on which a pattern is written (or "drawn") during pattern formation is arranged. The substrate 101 becomes a mask for exposure when a semiconductor device is produced by undergoing the subsequent processes. The substrate 101 includes mask blanks having a light-shielding film formed on a glass substrate and a resist applied to the light-shielding film and on which no pattern is formed.

The control unit 160 includes a control computer 110, a memory 112, a control circuit 120, and storage devices 140, 142 such as magnetic disk drives. The control computer 110, the memory 112, the control circuit 120, and the storage devices 140, 142 are mutually connected by a bus (not shown). In the control computer 110, a shot data generation unit 70, a merge processing unit 71, a loading effect correction amount calculation unit 72, a dose calculation unit 74, a mask information writing data generation unit 76, and a pattern writing processing unit 78. Functions such as the shot data generation unit 70, the merge processing unit 71, the loading effect correction amount calculation unit 72, the dose calculation unit 74, the mask information writing data generation unit 76, and the pattern writing processing unit 78 may be configured by hardware such as an electric circuit or software such as programs to execute such functions. Alternatively, such functions may be configured by combining hardware and software. Information input into or output from the shot data generation unit 70, the merge processing unit 71, the loading effect correction amount calculation unit 72, the dose calculation unit 74, the mask information writing data generation unit 76, and the pattern writing processing unit 78 and information in the process of calculation are each time stored in the memory 112.

First, pattern data (pattern writing data) of the mask pattern of each sub-region of a plurality of sub-regions created by dividing a pattern region of a desired pattern that will be formed on a semiconductor substrate (wafer) is input from outside and stored in the storage device 140. More specifically, pattern data (pattern writing data) of the pattern (mask pattern) of each sub-region after OPC corrections is input from outside and stored in the storage device 140. The pattern region of the pattern is divided and multiple exposure information in which divided region information indicating the position of each sub-region and information indicating the region division are defined is input from outside and stored in the storage device 140. Correlation data (condition data) of each sub-region acquired from the above simulation is input from outside and stored in the storage device 140. In the correlation data, illumination light information indicating a shape of illumination light paired with the mask pattern for each of the sub-regions and pupil surface information indicating the luminous flux shape in the pupil surface position are defined.

In the pattern writing apparatus 100, the shot data generation unit 70 first reads pattern data of each sub-region from the storage device 140 and generates apparatus specific shot data by performing multi-stage data conversion processing. To form a graphic pattern by the pattern writing apparatus 100, it is necessary to divide each graphic pattern defined in the pattern data into the size that can be irradiated with one beam shot. Thus, the shot data generation unit 70 generates shot graphics by dividing the graphic pattern indicated by the pattern data into the size that can be irradiated with one beam shot. Then, shot data is generated for each shot graphic. In the shot data, for example, graphic data such as the graphic type, graphic size, irradiation position, and dose is defined. The generated shot data of the mask pattern is temporarily stored in the storage device 142.

Figure 5A:
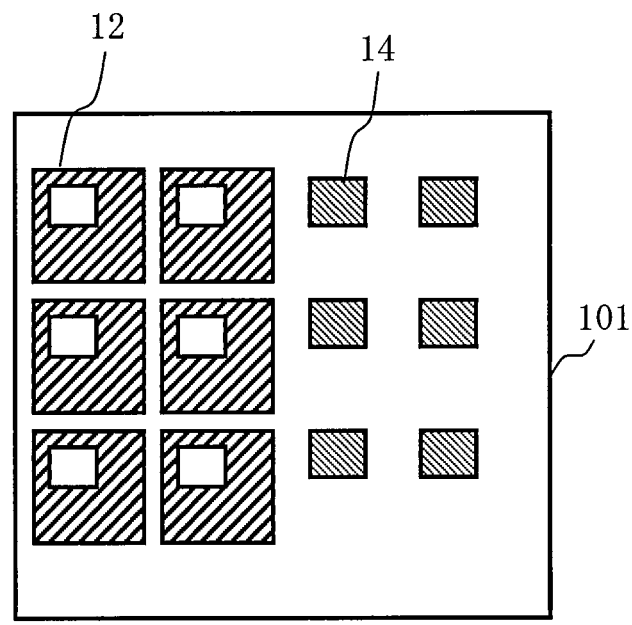
FIGS. 5A and 5B are conceptual diagrams for explaining pattern writing positions of mask patterns and merge processing of divided regions according to the first embodiment.
Figure 5B:
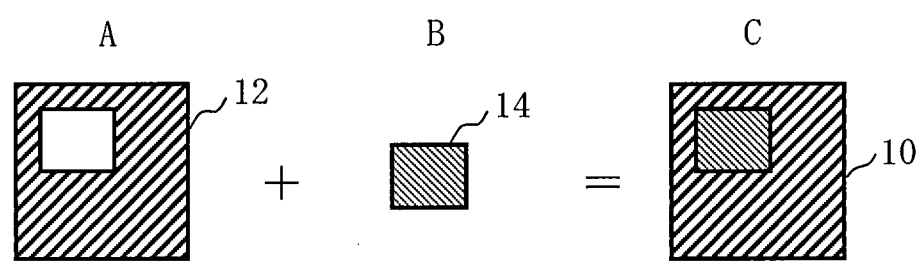

FIGS. 5A and 5B are conceptual diagrams for explaining pattern writing positions of mask patterns and merge processing of divided regions according to the first embodiment. When fabricating a semiconductor device, in addition to size fluctuations due to the optical proximity effect during transfer described above, a phenomenon called the loading effects causing size fluctuations resulting from development, etching, or planarization using a chemical mechanical polishing (CMP) device, which are processes after pattern formation, is known. Thus, it is desirable to correct size fluctuations resulting from the loading effects by adjusting the dose in the pattern writing apparatus 100. Thus, in the first embodiment, such size fluctuations are corrected in the pattern writing apparatus. Incidentally, loading effects are subject to arranging conditions of patterns located therearound. However, as described above, one pattern region is divided into a plurality of the sub-regions 12, 14 in the first embodiment. Then, when patterns are formed, as shown in FIG. 5A, the pattern of the sub-region 12 and the pattern of the sub-region 14 are formed in independent separate regions of the substrate 101 for mask production. Thus, a pattern near the division position has no pattern therearound.

This makes it difficult to include an influence of surrounding patterns. Thus, in the first embodiment, when the correction amount of the loading effects is calculated, as shown in FIG. 5B, the divided sub-regions 12, 14 are restored to the original state and the correction amount is calculated as the sub-region 10.

Thus, as the merge processing process, the merge processing unit 71 reads mask pattern data of each sub-region and merges the mask pattern of each sub-region to the position before the division. Accordingly, the sub-regions 12, 14 are merged into the pattern region 10.

As the size fluctuation correction amount calculation process, the loading effect correction amount calculation unit 72 calculates a correction amount $\Delta l$ that corrects pattern dimension errors in a mesh region created by virtually dividing a pattern region into a plurality of mesh regions by using a mask pattern after merging. The correction amount $\Delta l(x, y)$ can be defined by, for example, the following formula (1) using an area density $\rho_L(x, y)$ of the mesh area for loading effect corrections, a distribution function $g_L(x, y)$, and a loading effect correction coefficient $\gamma$. The loading effect correction amount calculation unit 72 is an example of a correction amount calculation unit. The size of the mesh region for loading effect corrections is suitably about 1/10 of the radius of influence of the loading effects. For example, the size is suitably set to about 1 mm.

$$\Delta l(x,y) = \gamma \cdot \int \rho_L(x-x', y-y') \cdot g_L(x-x', y-y') dx' dy' \quad (1)$$

By calculating the loading effect correction amount after patterns of sub-regions being merged as described above, the influence of patterns in a region divided portion can be taken into consideration. Thus, the precision of correction amount can be improved.

Next, as the dose calculation process, the dose calculation unit 74 calculates the dose for each piece of shot data. In addition to the optical proximity effect during transfer, size fluctuations due to the proximity effect caused by an electron beam when a pattern is formed on a mask can also arise. Thus, it is desirable to also make corrections of the proximity effect by the electron beam at the same time. Thus, in the first embodiment, such size fluctuations are corrected by adjusting the dose in the pattern writing apparatus. The proximity effect by an electron beam can be corrected by adjusting base doses of the beam $D_0$ and proximity effect correction coefficients $\eta$. In addition, an optimal combination of the base doses of the beam $D_0$ and the proximity effect correction coefficients $\eta$ exists. Thus, a dose $D(x, y)$ is calculated by using the base doses of the beam $D_0(\Delta l(x, y))$ and the proximity effect correction coefficients $\eta(\Delta l(x, y))$ that correct the loading effect correction amount $\Delta l(x, y)$ described above simultaneously while proximity effect corrections are maintained. The relationship between the base doses of the beam $D_0$ and the proximity effect correction coefficients $\eta$ in each dimension when the pattern dimension is varied while proximity effect corrections are maintained may be determined in advance by an experiment or the like. The dose $D(x, y)$ can be defined by the following formula (2) using the base doses of the beam $D_0(\Delta l(x, y))$ and a proximity effect-corrected dose $d(\eta(\Delta l(x, y), x, y)$:

$$D(x,y) = D_0(\Delta l(x,y)) \cdot d(\eta(\Delta l(x,y), x, y)) \quad (2)$$

where the proximity effect-corrected dose $d(\eta(\Delta l(x, y), x, y)$ can be defined by, for example, the following formula (3):

$$d(\eta(\Delta l(x,y), x, y) = \{(1/2) + \eta(\Delta l(x,y))\} / \{(1/2) + \eta(\Delta l(x,y)) \cdot U(x,y)\} \quad (3)$$

where the function U(x, y) can be defined by the following formula (4) using an area density $\rho_p(x, y)$ of the mesh region for proximity effect corrections and a distribution function $g_p(x, y)$:

$$U(x,y)=\int \rho_p(x-x',y-y') \cdot g_p(x-x',y-y')dx'dy' \quad (4)$$

The size of the mesh region for proximity effect corrections is suitably about 1/10 of the radius of influence of proximity effect corrections. For example, the size is suitably set to about 1 μm.

The dose D(x, y) is calculated as described above for each mesh region to create a dose map.

When a pattern is transferred to a wafer by using a fabricated mask, multiple exposures are needed because the pattern is divided into a plurality of sub-regions and the illumination shape and the pupil surface shape need to follow the above optimized conditions for each sub-region. However, conditions are different from sub-region to sub-region and settings may be made erroneously. Thus, in the first embodiment, a pattern is formed on the mask under the conditions that multiple exposures are needed because the pattern is divided into a plurality of sub-regions and the illumination shape and the pupil surface shape are specified for each sub-region as mask information.

As the mask information writing data generation process, the mask information writing data generation unit 76 has condition data and multiple exposure information for each sub-region input thereto to generate pattern writing data of a code graphic pattern indicating divided region information and information indicating the region division indicated by the multiple exposure information and illumination light information and pupil surface information indicated by the condition data. As the code graphic, the bar code, QR code (registered trademark) and the like are suitably used. At this point, the pattern writing position of the code graphic pattern is set to a position on the mask where code graphic pattern does not overlap with the mask pattern of each sub-region. The mask information writing data generation unit 76 may generate up to shot data of the code graphic pattern or the shot data generation unit 70 may generate shot data from pattern writing data of the generated code graphic pattern. The shot data (mask information data) of the generated code graphic pattern is temporarily stored in the storage device 142.

Then, as pattern writing process (S110), the pattern writing processing unit 78 controls the control circuit 120 so that the mask pattern for each sub-region is formed on the substrate 101 for mask production. Then, the pattern writing unit 150 controlled by the control circuit 120 forms the mask pattern of each sub-region corrected with the correction amount for each mesh region in an independent separate position on the substrate 101 for mask production for each sub-region. In other words, the mask pattern of a sub-region is formed in a separate position independent of mask patterns of other sub-regions for each sub-region on the substrate 101 to which a resist is applied. More specifically, as shown in FIG. 2, the mask pattern in each sub-region is formed so that the sub-region 12 and the sub-region 14 are independent separate positions. A more specific operation is as follows:

An electron beam 200 emitted from the electron gun assembly 201 (emitting unit) illuminates the whole first aperture plate 203 having a quadrangular hole through the illumination lens 202. The electron beam 200 is first shaped into a quadrangular shape. Then, the electron beam 200 having passed through the first aperture plate 203 and having a first aperture plate image is projected onto the second aperture plate 206 through the projection lens 204. Deflection control of the first aperture plate image on the second aperture plate 206 is exercised by the deflector 205 so that the shape and dimensions of the beam can be changed (variably shaped). Then, the electron beam 200 having passed through the second aperture plate 206 and having a second aperture plate image is focused by the objective lens 207 and deflected by the main deflector 208 and the sub-deflector 209 before being irradiated on a desired position of the target object 101 arranged on the XY stage 105 moving continuously. FIG. 1 shows a case when multi-deflection of two stages for the main deflector and the sub-deflector is used for position deflection. In such a case, the main deflector 208 may deflect the electron beam 200 of a relevant shot to the reference position of a sub-field (SF) created by virtually dividing a pattern writing region while following the stage movement and the sub-deflector 209 may deflect the beam of the shot to each irradiation position in the SF.

Then, as the mask information forming process (S112), the pattern writing processing unit 78 further controls the control circuit 120 so that the code graphic pattern is formed on the mask 101. Then, the pattern writing unit 150 controlled by the control circuit 120 forms the code graphic pattern in a position on the mask that does not overlap with the mask pattern of each sub-region. The operation of the pattern writing unit 150 is the same as the above operation.

By forming the code graphic pattern on the mask itself, as described above, conditions errors for transfer can be limited.

Figure 6A:
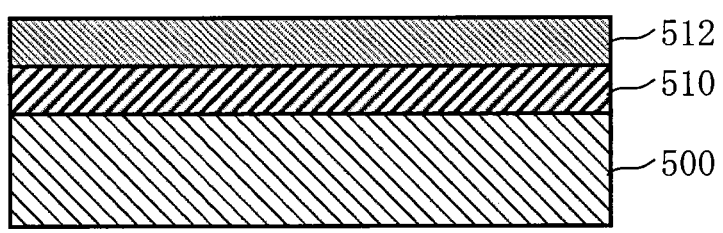
FIGS. 6A to 6C are diagrams showing an example of sectional views of processes of a method for fabricating a mask according to the first embodiment.
Figure 6B:
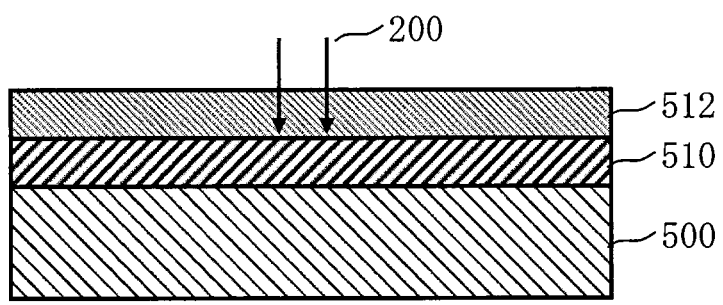
Figure 6C:
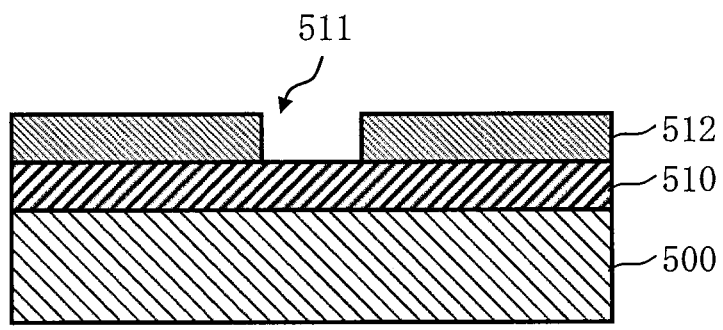

FIGS. 6A to 6C are diagrams showing an example of sectional views of processes of a method for fabricating a mask according to the first embodiment. FIGS. 6A to 6C show from the state of the mask 101 before a pattern is formed to the development process (S114). As shown in FIG. 6A, the substrate 101 for mask production before a pattern is formed has a light-shielding film 510 formed on a glass substrate 500 and a resist film 512 formed on the light-shielding film 510. Then, in the pattern forming process described above, as shown in FIG. 6B, a pattern is formed on the resist film 512 by using the electron beam 200.

Next, in FIG. 6C, as the development process (S114), the resist on the substrate 101 on which a pattern is formed is developed to form a resist pattern. More specifically, the substrate 101 after the pattern formation is developed to form a resist pattern by the resist film 512 in which an opening 511 is formed.

Figure 7A:
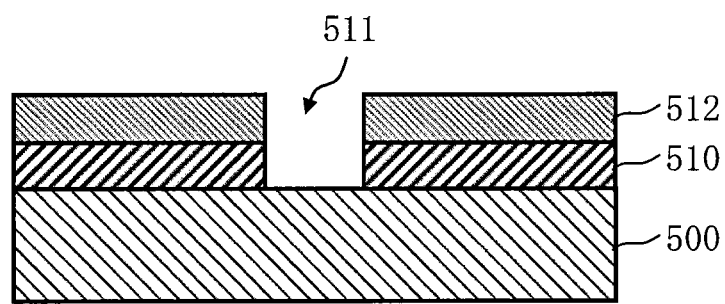
FIGS. 7A and 7B are diagrams showing another example of sectional views of processes of the method for fabricating a mask according to the first embodiment.
Figure 7B:
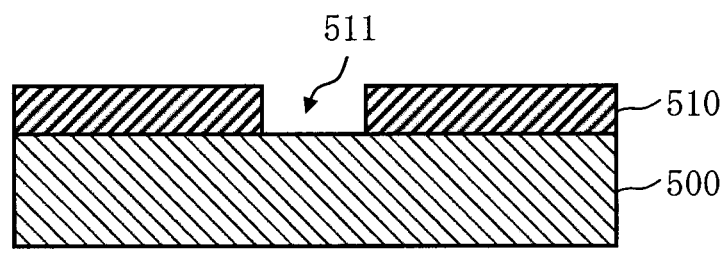

FIGS. 7A and 7B are diagrams showing another example of sectional views of processes of the method for fabricating a mask according to the first embodiment. FIGS. 7A and 7B show from the etching process (S116) to the completed mask.

Then, in FIG. 7A, as the etching process (S116), a mask pattern is formed on the substrate 101 by performing etching using the resist pattern. More specifically, the resist pattern by the resist film 512 is used as a mask to remove the light-shielding film 510 exposed to the opening 511 by etching. Then, the remaining resist film 512 is removed by ashing to form, as shown in FIG. 7B, a mask pattern.

Figure 8A:
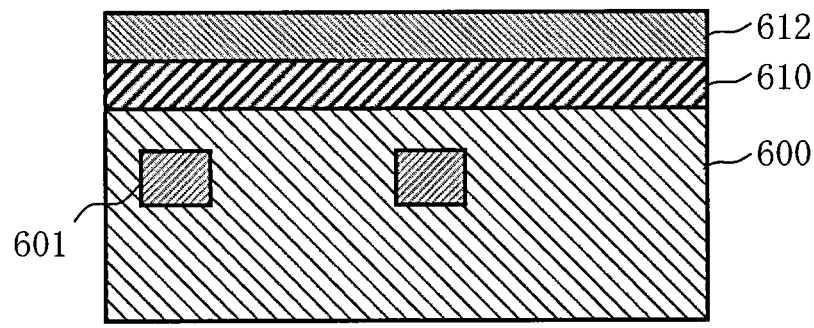
FIGS. 8A to 8C are diagrams showing another example of sectional views of processes of a method for processing a wafer according to the first embodiment.
Figure 8B:
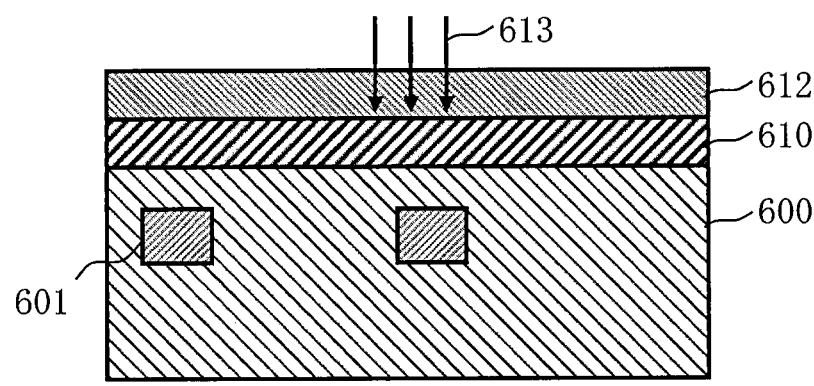
Figure 8C:
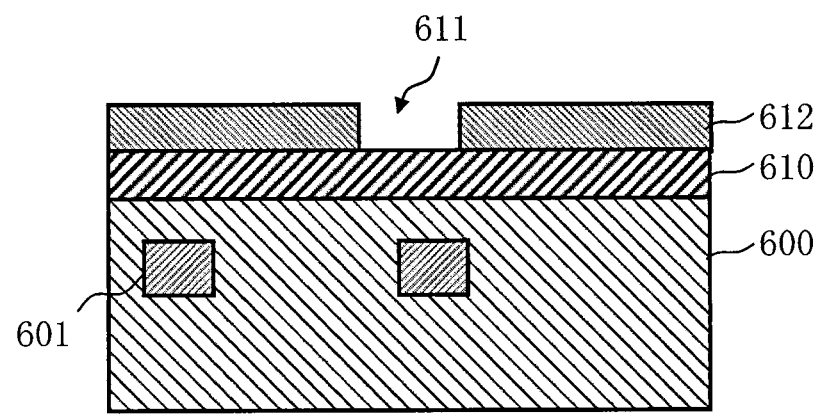

FIGS. 8A to 8C are diagrams showing another example of sectional views of processes of a method for processing a wafer according to the first embodiment. FIGS. 8A to 8C show from the state of a wafer before a pattern is transferred to the development process (S124). As shown in FIG. 8A, the wafer before a pattern is transferred has an insulating film 610 formed on a silicon substrate 600 and a resist film 612 formed on the insulating film 610. The silicon substrate 600 may also have a base pattern 601 such as a lower-layer wire formed therein.

In FIG. 8B, in the transfer process, the transfer apparatus 300 transfers the mask pattern of each sub-region under the above conditions for each sub-region by irradiating light 613 of a mask pattern image using a mask fabricated as described above as an exposure mask. As shown in FIGS. 3B to 3D, the transfer apparatus 300 includes a transfer unit 302 and a control unit 304. The transfer unit 302 includes a light source 303, the illumination shape adjustment substrate 308, the optical systems 305, 307, and the pupil surface optical shape adjustment substrate 306. The control unit 304 includes a control computer 310 and a control circuit 320. In the control computer 310, the reading unit 312, the judgment unit 313, a condition setting unit 314, and a transfer control unit 316 are arranged. Functions such as the reading unit 312, the judgment unit 313, the condition setting unit 314, and the transfer control unit 316 may be configured by hardware such as an electric circuit or software such as programs to execute such functions. Alternatively, such functions may be configured by combining hardware and software. Information input into or output from the reading unit 312, the condition setting unit 314, and the transfer control unit 316 and information in the process of calculation are each time stored in a memory (not shown).

The mask 101 is set to the light source 303 for transfer. Then, the illumination shape adjustment substrate 308 is irradiated with light emitted from the light source 303 by an illumination optical system (not shown). Then, the irradiated light changes the shape thereof by passing through the illumination shape adjustment substrate 308. The illumination shape adjustment substrate 308 has, for example, the surface divided in a mesh shape and each mesh region is configured to be able to open and close independently. In other words, light can pass through only open mesh regions 50 and closed mesh regions 52 block illumination light. Thus, the shape of passing light can be controlled by controlling mesh regions to be opened. As the illumination shape adjustment substrate 308, for example, a digital mirror array can be used. A pattern on the mask 101 is irradiated with the light having passed through the illumination shape adjustment substrate 308 as illumination light. The light having passed through the mask is enlarged by the optical system 305 to irradiate the pupil surface optical shape adjustment substrate 306 arranged in the pupil surface position between the optical systems 305, 307. Then, the irradiated light changes the shape thereof by passing through the pupil surface optical shape adjustment substrate 306. The pupil surface optical shape adjustment substrate 306 has, for example, the surface divided in a mesh shape and each mesh region is configured to be able to open and close independently. In other words, light can pass through only open mesh regions 60 and closed mesh regions 61 block light. Thus, the shape of light passing through the pupil surface can be controlled by controlling mesh regions to be opened.

As the mask information reading process (S118), the reading unit 312 optically reads first divided region information indicating positions of a plurality of sub-regions created by dividing a pattern region of a desired pattern that will be formed on a wafer, a plurality of pieces of first illumination light information indicating the mask pattern of each sub-region and the paired shape of illumination light, and a plurality of pieces of first pupil surface information indicating the shape of light on the pupil surface from the mask. It is needless to say that the first pupil surface information is omitted if pupil surface information is excluded from the conditions. More specifically, the reading unit 312 uses a reading apparatus (not shown) to optically read a code graphic pattern formed on the mask 101. Then, the reading unit 312 reads divided region information and information indicating the region division indicated by the multiple exposure information defined in the code graphic pattern and illumination light information and pupil surface information indicated by the condition data from the read code graphic pattern.

As the mask setup process, the fabricated mask 101 is set up.

As the judgment process (S119), the judgment unit 313 has a plurality of pieces of second illumination light information indicating the mask pattern of each sub-region and the paired shape of illumination light input from a user for each sub-region. Then, whether illumination light information defined in the code graphic pattern and illumination light information input by the user match is judged for each sub-region. Similarly, whether pupil surface information defined in the code graphic pattern and pupil surface information input by the user match is judged for each sub-region. If both pieces of information do not match, an error is output and the transfer process is stopped. To restart the transfer process, another mask is used or condition information such as the illumination light information and pupil surface information input by the user is changed and the transfer process is restarted from the mask information reading process (S118).

As the condition setting process, the condition setting unit 314 sets the shape of illumination light and the pupil surface shape as conditions for a sub-region A to be transferred of a plurality of sub-regions.

As the pattern A exposure process (S120), the transfer control unit 316 controls the control circuit 320 so that the mask pattern formed in the sub-region A (for example, the sub-region 12) to be transferred of the plurality of sub-regions is transferred to the wafer 301 under set conditions. The transfer unit 302 controlled by the control circuit 320 first opens/closes mesh regions of the illumination shape adjustment substrate 308 so that the set shape of illumination light is formed. Similarly, the transfer unit 302 opens/closes mesh regions of the pupil surface optical shape adjustment substrate 306 so that the set pupil surface shape is formed. Then, the transfer unit 302 transfers the combination of mask pattern acquired under the condition of the acquired combination of the shape of illumination light and the pupil surface shape for the sub-region 12 is transferred to the wafer 301. At this point, a portion of the mask may be shielded so that one of the plurality of sub-regions, for example, the sub-region 14 is not irradiated with illumination light.

Next, as the pattern B exposure process (S122), the transfer control unit 316 controls the control circuit 320 so that the mask pattern formed in another sub-region B (for example, the sub-region 14) to which the pattern is not transferred of the plurality of sub-regions is transferred to the wafer 301 under set conditions. The transfer unit 302 controlled by the control circuit 320 first opens/closes mesh regions of the illumination shape adjustment substrate 308 so that the set shape of illumination light is formed. Similarly, the transfer unit 302 opens/closes mesh regions of the pupil surface optical shape adjustment substrate 306 so that the set pupil surface shape is formed. Then, the transfer unit 302 transfers the combination of mask pattern acquired under the condition of the acquired combination of the shape of illumination light and the pupil surface shape for the sub-region 14 is transferred to the wafer 301. At this point, a portion of the mask may be shielded so that the other of the plurality of sub-regions, for example, the sub-region 12 is not irradiated with illumination light.

The transfer unit 302 makes multiple exposures of the wafer, as described above, so that partial patterns of divided sub-regions are sequentially transferred by transferring patterns to the wafer using combination conditions calculated for each sub-region. More specifically, the transfer unit 302 makes multiple exposures of the wafer 301 so that partial patterns of all the divided sub-regions 12, 14 are sequentially transferred by transferring the mask pattern of the sub-region to the wafer with illumination light in the shape and the pupil surface shape indicated by illumination light information judged to match for each sub-region. The transfer unit 302 is an example of an exposure unit.

Then, in subsequent processes, a desired pattern is formed on the multiple-exposure semiconductor substrate.

In FIG. 8C, as the development process (S124), the wafer after multiple exposures is developed to form a resist pattern by the resist film 612 in which an opening 611 is formed.

Figure 9A:
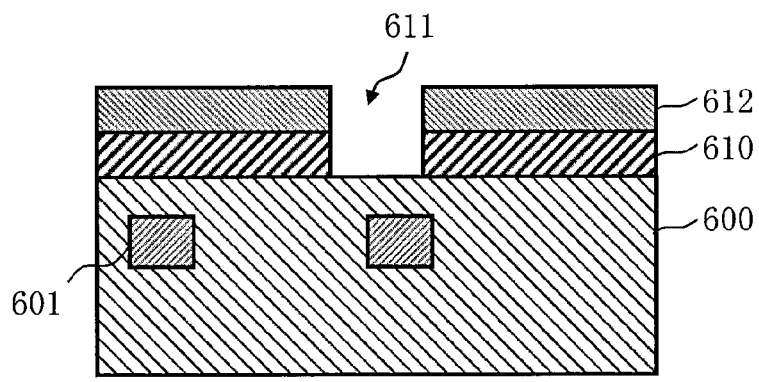
FIGS. 9A to 9C are diagrams showing still another example of sectional views of processes of a method for processing a wafer according to the first embodiment.
Figure 9B:
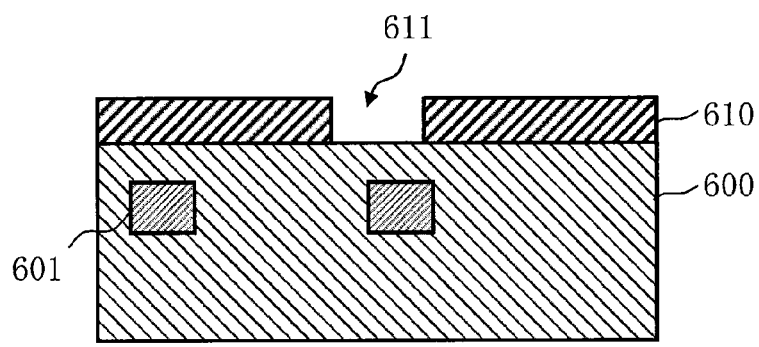
Figure 9C:
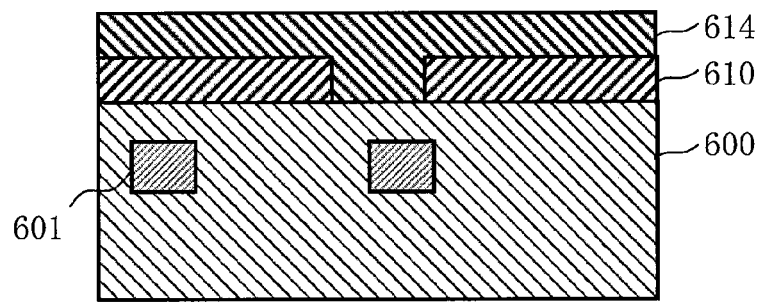

FIGS. 9A to 9C are diagrams showing still another example of sectional views of processes of a method for processing a wafer according to the first embodiment. FIGS. 9A to 9C show from the etching process (S126) to the film forming process (S128).

Then, in FIG. 9A, as the etching process (S126), the resist pattern by the resist film 612 is used as a mask to remove the insulating film 610 exposed to the opening 611 by etching. Then, the remaining resist film 612 is removed by ashing to form, as shown in FIG. 9B, the opening 611 to be a wiring groove in the insulating film.

Then, in FIG. 9C, as the film forming process (S128), a conductive film 614 is deposited on the insulating film 610 as if to fill up the opening 611. As the conductive film 614, for example, a copper (Cu) film may be used.

Figure 10:
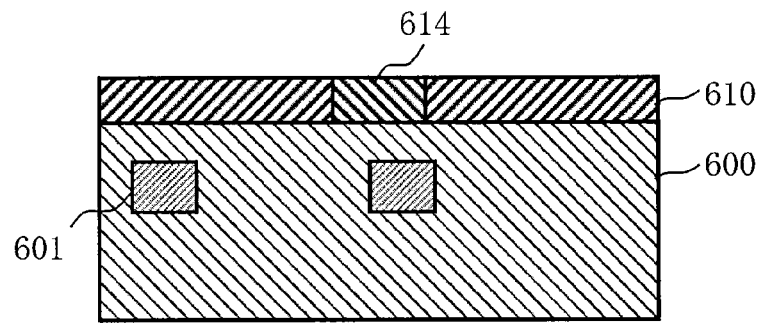
FIG. 10 is a diagram showing an example of the sectional view of the process of the method for processing the wafer according to the first embodiment.
Figure 11:
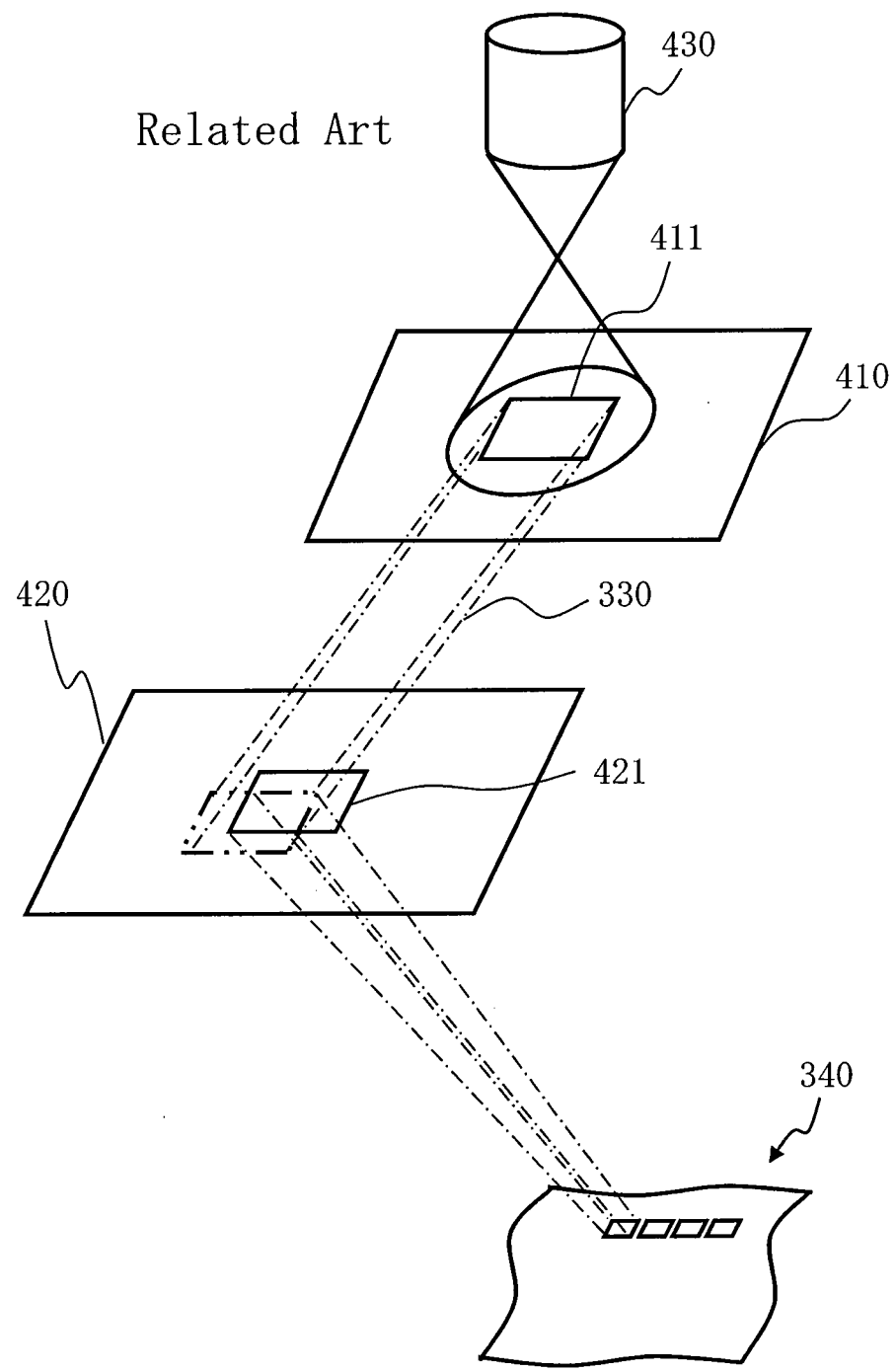
FIG. 11 is a conceptual diagram for explaining an operation of the variable-shaped electron beam pattern writing apparatus.

FIG. 10 is a diagram showing another example of the sectional view of the process of the method for processing the wafer according to the first embodiment. In FIG. 10, the planarization process (S130) is shown.

In FIG. 10, as the planarization process (S130), the excessive conductive film 614 bulging out from the opening 611 of the insulating film 610 is polished and removed by the CMP method and also the surface thereof is planarized. Accordingly, one layer of the wiring layer by the conductive film 614 can be formed. Each of the above processes may be repeated to form a multilayer interconnection.

According to the first embodiment, as described above, dimension errors of a pattern to be transferred to a semiconductor substrate in the end can be reduced. Also according to the first embodiment, size fluctuations can be corrected with higher precision. Also according to the first embodiment, pattern data capable of further reducing dimension errors of a pattern transferred to a semiconductor substrate in the end can be generated.

In the foregoing, an embodiment has been described with reference to concrete examples. However, the present invention is not limited to such concrete examples.

Parts of the apparatus configuration, the control method, and the like which are not needed to be explained directly for the explanation of the present invention are not described. However, a necessary apparatus configuration and a necessary control method can be appropriately selected and used. For example, a control unit configuration which controls the pattern writing apparatus 100 is not described. However, a necessary control unit configuration is appropriately selected and used, as a matter of course.

In addition, all charged particle beam pattern writing apparatuses and pattern writing methods which include the elements of the present invention and can be attained by appropriately changing in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device, comprising:
    dividing a pattern region of a desired pattern that is to be formed on a semiconductor substrate into a plurality of sub-regions, the pattern region defining a region on the semiconductor substrate to form the desired pattern;
    calculating combination conditions including a shape of illumination light for transferring and a mask pattern obtained by correcting a partial pattern in the sub-region of the desired pattern formed on a mask used during the transferring for each of the plurality of sub-regions, using correlation data among shape of the illumination light, and a pattern shape of a mask pattern to make a dimension error of the partial pattern of each of the plurality of sub-regions smaller than a threshold when transferred to the semiconductor substrate; and
    forming the desired pattern by making multiple exposures on the semiconductor substrate in such a way that the partial patterns of the sub-regions are sequentially transferred by the transferring the mask pattern to the semiconductor substrate coated with a resist using the combination conditions calculated for each of the sub-regions and then the semiconductor substrate is developed.

2. The method according to claim 1, wherein the combination conditions include a pupil surface shape of light in a pupil surface position during transfer.

3. The method according to claim 2, further comprising:
    correcting the mask pattern so as to bring a transfer pattern obtained when the mask pattern is transferred to the semiconductor substrate closer to the partial pattern under conditions of the shape of the illumination light calculated for each of the sub-regions and the pupil surface shape of the light in the pupil surface position during the transferring for each of the sub-regions.

4. The method according to claim 3, further comprising:
    generating the correlation data of the shape of the illumination light during the transferring, a shape of the corrected mask pattern, and the pupil surface shape.

5. The method according to claim 4, further comprising:
    calculating dimensions of the transfer pattern formed on the semiconductor substrate using the mask pattern corrected under the conditions by doing a simulation using the shape of the illumination light during transfer, the shape of the corrected mask pattern, and the pupil surface shape for each of the sub-regions.

6. The method according to claim 5, further comprising:
    judging whether the dimension error between the partial pattern and the transfer pattern obtained by doing the simulation is smaller than the threshold.

7. The method according to claim 6, wherein the calculating of the combination condition, the correcting of the mask pattern, the generating of the correlation data, and the simulation are repeated until, as a result of judgment, the dimension error becomes smaller than the threshold.

8. The method according to claim 7, further comprising:
writing the mask pattern of the sub-region in an independent separate position from the mask patterns of an another sub-regions on the substrate to which the resist is applied for each of the sub-regions.

9. The method according to claim 8, further comprising:
forming a resist pattern by developing the resist on the semiconductor substrate on which the pattern is formed.

10. The method according to claim 9, further comprising:
forming the mask pattern on the substrate by performing etching using the resist pattern.

11. The method according to claim 1, wherein the combination condition includes a pupil surface shape of light in a pupil surface position during the transferring, further comprising:
correcting the mask pattern so as to bring a transfer pattern obtained when the mask pattern is transferred to the semiconductor substrate closer to the partial pattern under the combination conditions including the shape of the illumination light calculated for each of the sub-regions and the pupil surface shape of the light in the pupil surface position during transfer for each of the sub-regions;
generating the correlation data to further include correlations of a shape of the illumination light during the transferring, the shape of the corrected mask pattern, and the pupil surface shape;
calculating dimensions of the transfer pattern formed on the semiconductor substrate using the mask pattern corrected under the conditions by doing a simulation for each of the sub-regions;
judging whether the dimension error between the partial pattern and the transfer pattern obtained by doing the simulation using the shape of the illumination light during the transferring, the shape of the corrected mask pattern, and the pupil surface shape is smaller than the threshold,
wherein the calculating of the combination condition, the correcting of the mask pattern, the generating of the correlation data, and the simulation are repeated until, as a result of judgment, the dimension error becomes smaller than the threshold, further comprising:
writing the mask pattern of the sub-region in an independent separate position from the mask patterns of an another sub-regions on the substrate to which the resist is applied for each of the sub-regions;
forming a resist pattern by developing the resist on the semiconductor substrate on which the pattern is written; and
forming the mask pattern on the substrate by performing etching using the resist pattern.

* * * * *